United States Patent [19]

Lawrence

[11] 3,719,860

[45] March 6, 1973

[54] CIRCUIT COMPONENT MOUNTING WITH COOLING PLATE

[75] Inventor: Robert Lawrence, Encino, Calif.

[73] Assignee: Burroughs Corporation, Detroit, Mich.

[22] Filed: Sept. 30, 1971

[21] Appl. No.: 185,147

[52] U.S. Cl..........317/100, 174/DIG. 3, 317/101 CE, 339/17 CF, 339/112 R

[51] Int. Cl...........H05k 7/20

[58] Field of Search..........317/100, 101 DH, 101CE, 101 CM, 317/101 D; 339/17 C, 17 CF, 112; 174/DIG 3, DIG 5

[56] References Cited

UNITED STATES PATENTS

| | | | |
|---|---|---|---|
| 3,495,131 | 2/1970 | Melcher | 317/100 |
| 2,984,774 | 5/1961 | Race | 174/DIG. 5 |
| 3,202,869 | 8/1965 | Matson | 317/100 |
| 3,325,582 | 6/1967 | Ehrmann | 174/DIG. 5 |
| 3,201,655 | 8/1965 | Brady | 317/101 D |

FOREIGN PATENTS OR APPLICATIONS

| | | | |
|---|---|---|---|
| 242,157 | 12/1962 | Australia | 317/101 CM |

OTHER PUBLICATIONS

"Joining Dip Modules to Printed Circuit Cards," Morgan and Richardson, IBM Technical Discosure Bulletin, Vol. 11, No. 7, 12/68.

*Primary Examiner*—Robert K. Schaefer
*Assistant Examiner*—Gerald P. Tolin
*Attorney*—Richard D. Seibel et al.

[57] ABSTRACT

An apparatus is disclosed for controlling the thermal environment of a circuit component mounted to a circuit board. A thermally conductive plate such as an aluminum extrusion serves to mount a plurality of components such as dual-in-line packages (DIPs). Each component has a plurality of leads extending in the same direction therefrom and is mounted to one surface of the plate with the leads extending away from, and aligned with, an elongated opening through the plate. One side of a circuit board is mounted adjacent the other surface of the plate by mounting means coupled between the board and the plate. The mounting means includes a plurality of pins each having one end extending through and insulated from the elongated opening in the plate, into contact with an associated lead on the component, and the other end extending through a hole in the circuit board. A desired circuit may be formed by electrically interconnecting selected pins on the opposite side of the circuit board.

17 Claims, 6 Drawing Figures

INVENTOR.
ROBERT LAWRENCE
BY
Christie, Parker & Hale
ATTORNEYS

CIRCUIT COMPONENT MOUNTING WITH COOLING PLATE

BACKGROUND OF THE INVENTION

This invention relates to the mounting of circuit components to circuit boards. More particularly, the invention relates to an apparatus and method for controlling the thermal environment of a circuit component so mounted.

A common type of electronic component, known as a dual-in-line integrated circuit package (DIP), has a simple rectangular parallelepiped of nonconductive material encapsulating the active elements of the component. In order to connect the integrated circuit elements within the component to an external circuit, a plurality of electrical leads are provided through the nonconductive encapsulation. These leads, conventionally 14 or 16 in number, extend outwardly from opposite sides of the component so that all leave the component in a common plane, half extending in one direction and half extending in the opposite direction. A short distance after leaving the non-conductive encapsulation of the component, the leads are bent at substantially a right angle so that all of the leads extend parallel to each other in a pair of rows and extend a substantial distance from the component.

These packages are then usually mounted directly to a circuit board by inserting the terminal pins or leads in corresponding female sockets defined in or on the board and sometimes by securing the non-conductive housing to the board. The sockets may be connected together by a printed circuit in or on the reverse side of the board. Additionally, the sockets may be fabricated with wire-warp pins extending from the reverse side of the board and a circuit may be formed by wire-wrapping the pins into a desired pattern. Alternatively, the terminal pins may be disposed through aligned holes defined in the board and may be soldered to a printed circuit on the opposite side of the board, or may be wire wrapped. In other arrangements the leads on the component may be secured to pins extending through the board to be wire wrapped, soldered, or welded on the opposite side.

There are disadvantages to mounting a circuit component to a circuit board in the manners above described. Most importantly, such arrangements do not provide effective cooling of the component. The circuit board is usually laminated of epoxy impregnated glass fabric which does not have a very high thermal conductivity. Cooling of the component must rely solely on natural or forced convection cooling which is not always sufficient.

A disadvantage of the technique using sockets is that such sockets add weight and complexity to the board and rely on friction forces for contact with the terminal pins on the component. In some cases, shocks and vibrations may loosen a component or cause circuit noise. If the terminal pins are disposed through holes in the board and are then soldered to a circuit pattern on the opposite side of the board or wire wrapped into a desired circuit, there is no effective and efficient way of testing the board prior to soldering or wire wrapping to make sure all the proper connections are made. Also, there is no efficient way of testing the components prior to soldering or wire wrap so that any defective components may be replaced at an early stage.

It is desirable, therefore, to provide apparatus for mounting a circuit component to a circuit board whereby the component is properly cooled and which permits the circuit board and circuit components to be properly tested with the component in place.

BRIEF SUMMARY OF THE INVENTION

In practice of this invention according to a presently preferred embodiment there is provided a combination of a circuit component having a plurality of terminal pins or leads extending is substantially the same direction therefrom and a thermally conductive plate. The component is mounted to one surface of a plate with the pins extending away from, and aligned with, an elongated opening through the plate. The combination further includes a circuit board having a side mounted adjacent the other surface of the plate by mounting means coupled between the board and the plate. The mounting means includes a plurality of pins each having one end extending through the elongated opening in the plate into contact with an associated lead on the component and another end extending through a hole in the board. The circuit component may be incorporated in a desired circuit by interconnecting pins on the opposite side of the board, such as by wire wrapping or soldering, depending on the nature of the circuit board.

An important feature of this invention is the excellent cooling of the circuit component. Specifically, the thermally conductive plate provides efficient conduction cooling of each circuit component in addition to ordinary convection cooling experienced by the component. In a further aspect of the invention, the plate may finned on its one side to provide even more efficient convection cooling of the plate and thus of the circuit component.

Another aspect of this invention is that the entire circuit may be completely wire wrapped or soldered (depending on the board used) before the circuit components are permanently mounted in place. This allows both the circuitry and circuit component to be tested prior to use. Furthermore, the circuit and circuit component may be tested with the components in place on the board.

DRAWINGS

These and other features and advantages of this invention will be appreciated as the same becomes better understood by reference to the following detailed description of a presently preferred embodiment when considered in connection with the accompanying drawings wherein.

DESCRIPTION

Figure 1:
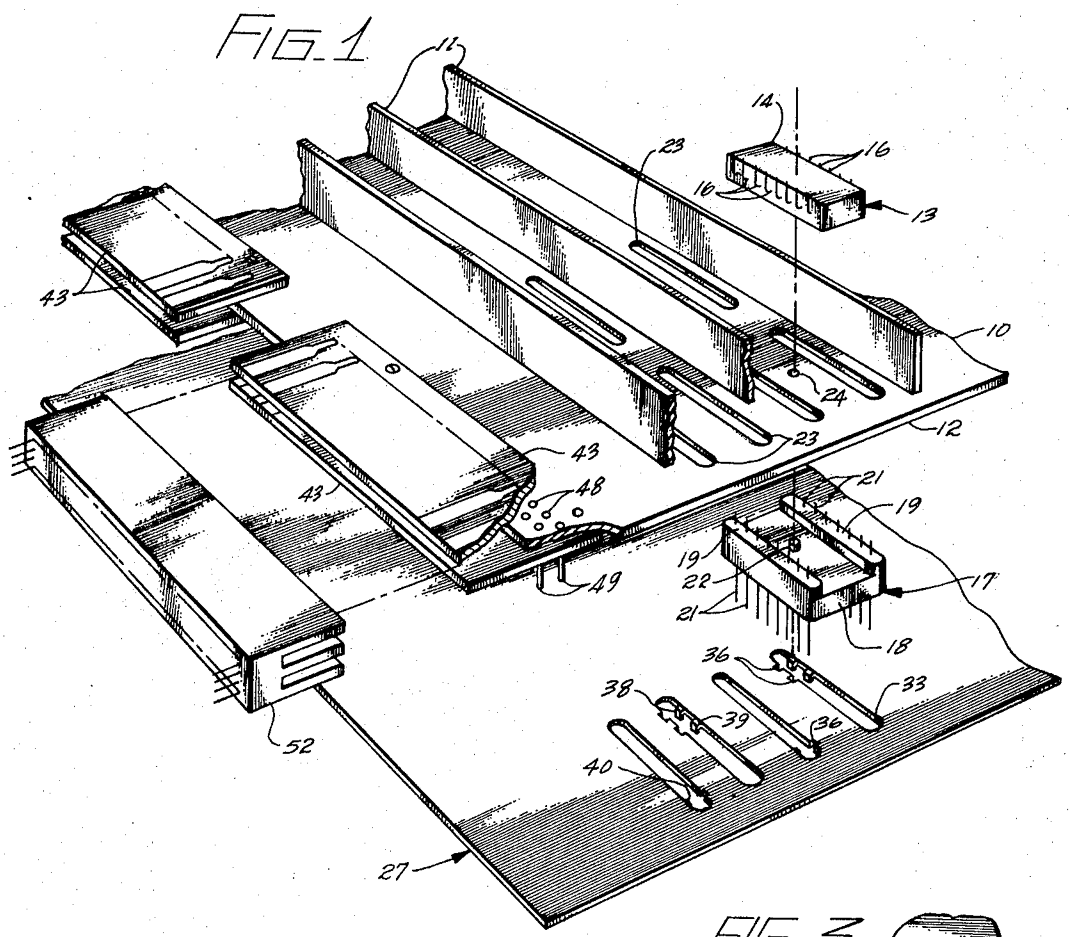
FIG. 1 is an exploded perspective view of a circuit component mounting assembly constructed according to this invention.

FIG. 1 illustrates in exploded perspective a portion of a component mounting assembly constructed according to principles of this invention. Principal structural support for the assembly is provided by a metal plate 10 on one face of which are a plurality of parallel upstanding ribs or fins 11. Preferably the ribbed plate is formed as an aluminum extrusion for lowest cost and ease of manufacture, and also since the aluminum has high thermal conductivity. The ribs 11 end a short distance from the edge 12 of the plate to provide a region for mounting the plate, as will be apparent hereinafter. Typically, the plate and ribs may be in the order of about 35 to 50 mils thick to provide adequate structural rigidity and thermal conductivity for mounting circuit components.

A dual in-line integrated circuit package (DIP) 13 is illustrated in FIG. 1 exploded from the plate 10. This DIP 13 is typical of a large number (not illustrated) of such packages which in practice are mounted on the plate 10. The DIP 13 is a conventional component comprising an electrically insulating body 14 typically made of plastic within which is encapsulated any of a broad variety of commercially available integrated circuits. Extending from each side of the body 14 are a plurality of electrical leads 16, of which are conventionally 14 or 16 in the commercially available DIPs. The leads extend laterally from the sides of the body a short distance and then each is bent at a right angle so that all of the electrical leads extend parallel to each other and normal to the face of the DIP. The DIP 13 is mounted on the plate 10 in what has become known as a "dead but" fashion wherein the DIP lies with its back adjacent the plate 10 and the leads 16 extend outwardly from the plate in the manner of a dead bug lying on its back with its feet in the air. Such a "dead bug" connection is shown by R. T. Morgan, and W. J. Richardson in IBM Technical Disclosure Bulletin, Volume 11, No. 7, 1968, at pages 736 and 737.

On the opposite side of the plate 10 from the DIP 13 is mounting member 17 comprising an insulating body 18 having raised pads 19 about 40 mils high along each side edge thereof. Extending through the body 18 and pads 19 are a plurality of metal pins 21, which are typically fourteen or sixteen in number to correspond to the number of electrical leads 16 on the corresponding DIP. Preferably, the pins 21 are square rather than circular for best electrical contact with the leads 16 and with conventional wire wrapping hereinafter mentioned. Centrally located between the pads 19 is a raised circular boss 22 on the insulating body 18.

Between the ribs 11 on the metal plate 10 are a plurality of elongated openings 23 therethrough. A pair of such openings are provided for each location at which a DIP is to be arranged, and the openings are sized and positioned to provide clearance for the raised pads 19 on the mounting member 17. Centrally located between a pair of the elongated openings 23 is a circular alignment hole 24 into which the boss 22 on the mounting member fits to provide precise positioning thereof.

Figure 2:
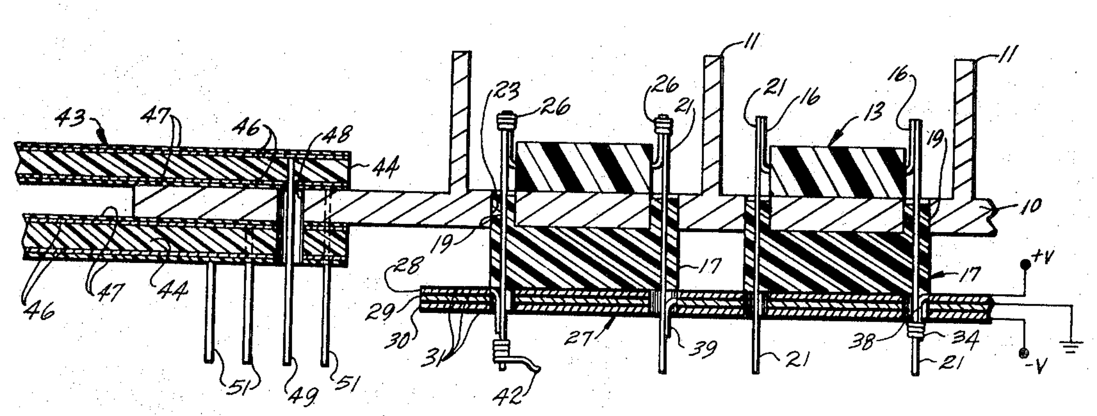
FIG. 2 is a transverse cross-sectional view of an assembled mounting combination.

FIG. 2 illustrates the plate 10, DIPS 13, and mounting member 17 assembled into position, rather than exploded as in FIG. 1. As seen therein, the mounting member 17 is engaged with one face of the metal plate 10 so that the pads 19 fit into the elongated openings 23 through the plate. The boss 22 and hole 24 (not shown in FIG. 2) serve to position the mounting member rather precisely on the metal plate, and alignment of the mounting member is assured by the elongated openings 23. The pins 21 extend through the pads 19 so as to stand a substantial distance above the face of the plate 10 in the region between the ribs or fins 11. When a DIP 13 is placed on its back against the metal plate 10, the leads 16 are each adjacent one of the pins 21 and electrical contact is made between the pins and leads by simple frictional engagement. Such simple contact is merely temporary, however, but does give the assembler an opportunity to verify the circuitry after assembly of DIPs in the entire assembly before more permanent connections are made. After such testing, the leads and pins may be permanently interconnected by wrapping them with a wire 26 as illustrated in a portion of FIG. 2. Such wire wrapped connections are conventional and can be made with great rapidity by automatic equipment. If preferred, the leads and pins can be soldered together as in conventional practice.

In assembling the mounting members 17 and DIPs 13 on the metal plate, it is preferred to employ a small amount of adhesive between these members so that good mechanical bonding is obtained even before the pins and leads are permanently connected together. In addition, the adhesive between the body 14 of the DIP and the face of the metal plate 10 provides good thermal conduction so that the heat generated within the integrated circuit package can be transferred to the metal plate with high effectiveness. When the leads and pins are interconnected by wire wrapping or soldering there is sufficient mechanical strength to hold the mounting member 17 and DIPs 13 in place without additional adhesive; however, the use of adhesive is preferred during the course of assembly and also to provide high thermal contact between the DIP and metal plate.

On the opposite face of the mounting member 17 from the metal plate 10 is a conductor sheet 27, which is sufficiently smaller than the metal plate 10, to leave a margin of plate around the entire edge of the assembly. The conductor sheet seen in cross section in FIG. 2 comprises three sheets of copper 28, 29, and 30, each about 4 mils thick. These copper layers are each insulated by conventional plastic insulation layers 31, typically about 2 mils thick. The copper layers are electrically connected as illustrated schematically in FIG. 2 with one layer 28 being connected to a positive voltage and another layer 30 being connected to a negative voltage. The third copper layer 29 is connected to ground. In this way, both the positive and negative supply voltages and a common ground can be distributed over the entire assembly for connection to appropriate leads of the integrated circuit packages as may be required.

Figure 3:
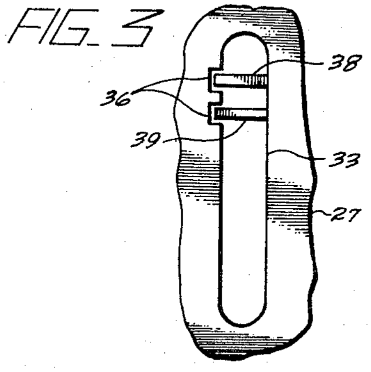
FIG. 3 is a fragmentary view of a slit through a connection board in the assembly of FIG. 1.

To make electrical connection to the pins 21 on the mounting members, an elongated slot 33 is provided through the conductor sheet for providing clearance for most of the pins 21 on the mounting member. Thus, each of the elongated slots 33 corresponds approximately to one of the elongated openings 23 through the metal plate. One of these slots 33 is illustrated in plan view in FIG. 3. The slot 33 extends through the entire conductor sheet 27 except that copper tabs integral with the copper layers in the conductor sheet may protrude into the slot for electrical connection. Thus, for example, the copper sheet 28 is provided with a tab 38 extending into the slot 33 in a direction transverse to the principal length of the slot. In the region adjacent the tab 38 the other copper layers 29 and 30 and the insulation layers 31 are absent so that the copper tab 38 protrudes.

When the conductor sheet 27 is assembled adjacent the mounting member 17, the tab 38 is bent in a direction away from the mounting member and lies adjacent one of the pins 21 for making electrical contact thereto. To provide good electrical contact, a wire 34 is wrapped around the protruding tab and the corresponding pin 21 in a conventional manner, as illustrated in FIG. 2. Similarly, a tab 39 on the copper layer 29 can provide electrical contact to ground for a pin of the mounting member. Another tab 40 (FIG. 1) on the negative voltage layer 30 can be used for providing negative supply voltage to those DIPs requiring it.

In order to obtain tabs 38, 39 and 40 sufficiently long to wire wrap connections to the pins 21, means must be provided for obtaining a tab longer than the width of the slot 33. An enlarged cutaway portion 36 is therefore made on the opposite side of the slot 33 from the tabs in order to provide clearance. The cutaway portions 36 are preferred to merely making a wider slot 33 in order to maintain sufficient strength in the conductor sheet 27.

After the appropriate wire wrapped connections are made between copper tabs from the conductor sheet and the pins 21, the balance of the required circuit interconnections are made by conventional wire wrapping. According to this technique, a wire 42 is wound around a pin 21 and led to some other appropriate pin 21 to make electrical connection therebetween. A pattern of such wire wrapped interconnections provides the interconnection between the DIPs mounted on the metal plate in a conventional manner roughly analogous to use of a printed circuit board or the like.

The steps in assembly of a combination as illustrated in FIGS. 1 and 2 typically commences by placing the mounting members 17 in position on the metal plate 10 with a sufficient amount of adhesive for holding them in place. The conductor sheet 27 with appropriate copper tabs 38, 39, and 40 extending into the slots 33 is then placed over the assembled mounting members 17. The copper tabs may be prebent into position or can become bent upon assembly of the conductor sheet over the mounting members. The interconnections between the copper tabs and the pins 21 are then wire wrapped to assure good electrical interconnection. Following this, the wire wrapping of the interconnections between the pins 21 proceeds so that the wiring of the entire assembly is completed before any DIPs are installed. This permits electrical testing of the wired interconnections before the more expensive DIPs are assembled in place. After verifying the electrical wiring, DIPs 13 may be inserted between the pins 21 and adhesively bonded to the metal plate 10 between the pins 11. Again, electrical testing of the entire assembly can be conducted to assure that appropriate and perfect DIPs have been installed. Thereafter, the leads 16 of the DIPs may be wire wrapped to the pins 21 to complete the permanent installation.

To make electrical interconnection between the assembly illustrated in FIGS. 1 and 2 and other circuits in a computer or other electrical apparatus in which the assembly may be used, a plurality of connection cards 43 are provided along one edge of the metal plate 10. As best seen in the cross section of FIG. 2, each of the cards 43 preferably comprises a substantially rigid non-conductive substrate 44, on each face of which conductive patterns 46 are formed. A layer of insulation 47 preferably overlies at least a portion of the area of the conductors 46. Such insulation prevents shorting between a conductor and the metal plate 10, for example.

A plurality of clearance holes 48 are provided through the metal plate 10 and a conductor pin 49 is passed through each of such holes. One such pin is illustrated in FIG. 2 extending through the clearance hole 48 and making electrical connection to the metal layer 46 on the top of the upper board 43. In a similar manner additional pins 51 are connected to the other conductive layers on the cards 43 so that in a typical embodiment four rows of such pins are connected to patterns in the conductive layers on each side of each of the two cards 43.

The conductive areas 46 on the cards 43 are in a unique pattern of strips as best seen in FIG. 1 so that each of the conductive areas is electrically connected to an individual pin 51. The edges of the cards 43 having these conductive patterns 46 thereon extend beyond the edge of the metal plate 10 to form a pair of parallel male connector sheets to which a dual female connector 52 (shown schematically in FIG. 1) may be connected in a conventional manner. Wire wrapping between the pins 49 and 51 and the pins 21 on the mounting member 17 provides electrical interconnection between the circuit components in the illustrated combination and other elements of a computer or similar electronic apparatus.

As mentioned hereinabove, the individual mounting members 17 are positioned on the metal plate 10 by a raised boss 22 that engages a hole 24 through the plate. The degree of positioning required is determined by the tolerances of the automatic equipment used for wire wrapping the pins 21 extending from the mounting members. The relative positioning between mounting members is thus determined by the precision of location of the holes 24. In order to minimize the number of such holes that may be required, it is contemplated that a mounting member such as that illustrated in FIG. 4 may be employed wherein an elongated insulating body 36 has a plurality of elongated raised pads 57 along each edge. When assembled these pads would extend into apertures 23 through a metal plate in substantially the same manner as has been illustrated hereinabove in FIGS. 1 and 2. Metal pins 58 extend through the mounting body 56 to form rows to which DIPs may be connected in the same manner as hereinabove described.

Figure 5:
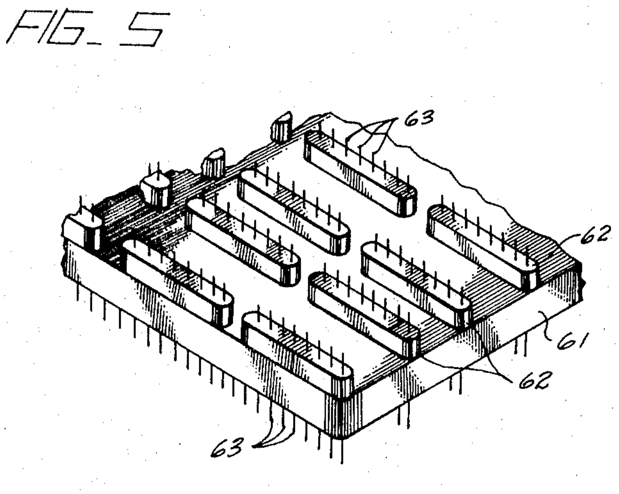
FIG. 5 illustrates still another embodiment of mounting means.

FIG. 5 illustrates still another embodiment of mounting member constructed according to principles of this invention. As illustrated in this embodiment an insulating sheet 61 has a plurality of raised pads 62 on one face thereof for fitting into corresponding slots in the metal plate. Pins 63 extend through the insulating body 61 for making electrical interconnections between DIPs and conventional wire wrapping in substantially the same manner as hereinabove described.

When electronic components are used a small amount of heat may be generated in each component. In integrated circuit packages the high packing density of components may lead to substantial amounts of heat being generated in a relatively small volume. The mounting assembly provided in practice of this invention aids in dissipating the heat that may be generated during operation of the electronic circuits. Heat generated in a DIP 13 is conducted to the metal plate 10 through the adhesive layer (not shown) therebetween. This heat is then conducted through the aluminum plate to the fins or ribs 11 where it is lost to the environment by convection.

Figures 4, 6:
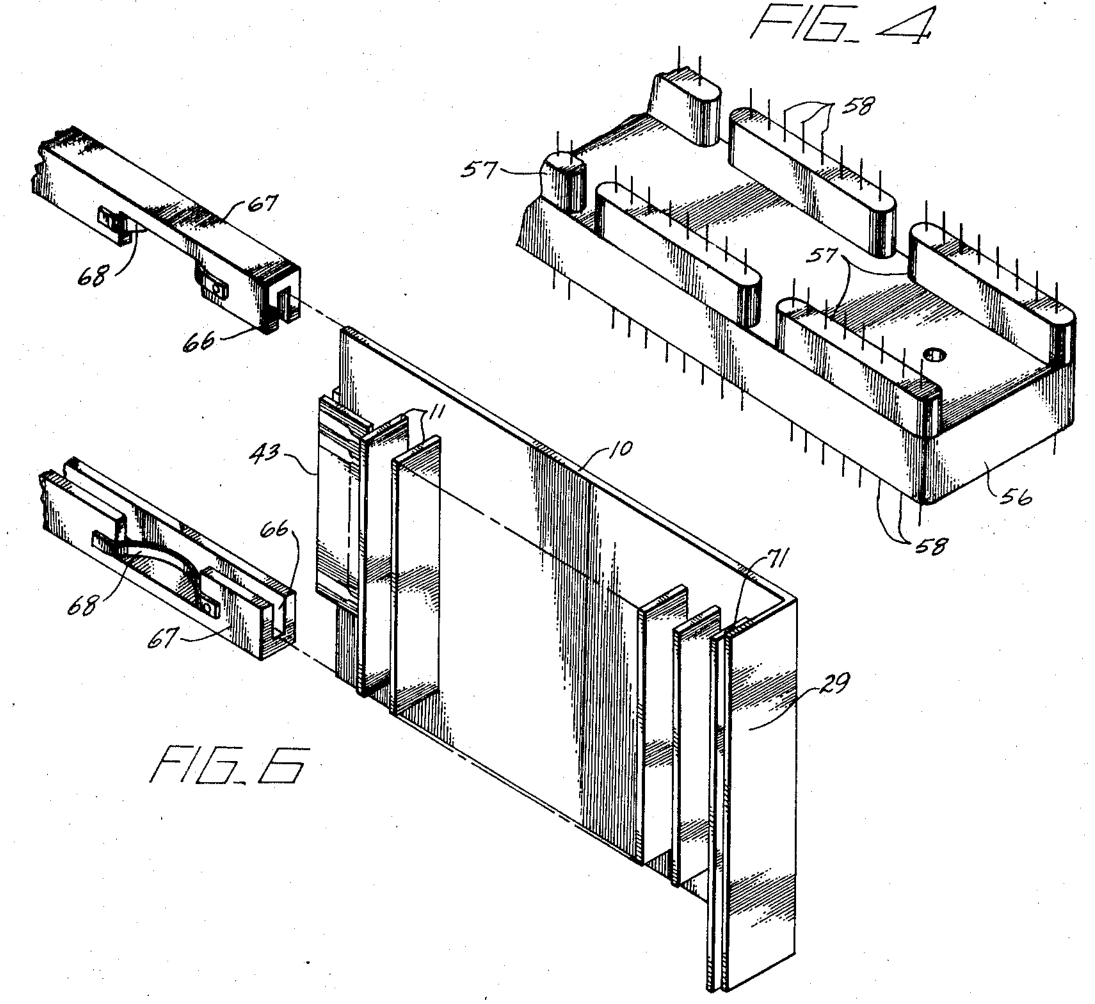
FIG. 4 is a prospective view of a portion of another embodiment of mounting means useful in practice of this invention.
FIG. 6 illustrates, partly schematically, installation of an assembly in an apparatus.

FIG. 6 illustrates a typical mounting arrangement for an assembly as hereinabove described and illustrated. FIG. 6 is principally schematic in illustrating a rather small scale assembly of a metal plate 10 with integral fins 11, and it will be understood that DIPS and other circuit elements are mounted on the metal plate 10 as hereinabove described. Such elements are deleted from FIG. 6 for clarity. When the metal plate 10 is installed in a computer or other electronic apparatus, it is preferably inserted into the grooves 66 of opposing U-shaped mounting channels 67. These U-shaped channels form an integral part of electronic apparatus and are preferably formed of aluminum or other material having relatively high thermal conductivity so that heat from the metal plate 10 can be conducted by the channels to other portions of the apparatus for dissipation into the environment. A spring 68 is preferably mounted on each channel so as to press the metal plate against the opposite side of the channel and provide good thermal contact between the metal plate 10 and the channel 67. This serves not only to provide good thermal contact but also to hold the metal plate in place. The circuit cards 43 are provided on the inserted edge of the metal plate 10 so that when the plate is pressed into the channel 67 electrical connection is made to a female connector (not shown in FIG. 6). It will be apparent that instead of U-shaped channels an H-shaped member can be used so that a plurality of assemblies can be provided one above another in an electronic apparatus.

It is preferred that the metal plates can be inserted so that the fins 11 extend in a substantially vertical direction when installed in the apparatus. This permits natural convection to pass up through the apparatus for cooling the fins 11. This is typically not sufficient, however, and forced convection of air upwardly through the apparatus is more conventionally applied. To contain such forced convection a flange 69 is provided along the outside edge of the metal plate 10 and a flexible seal 71 extends from the edge of the flange. Thus when the plurality of plates 10 are assembled parallel to each other the several flanges 69 and flexible seals 71 serve to enclose the face of the electronic apparatus into which the metal plates 10 are inserted. It will be apparent, of course, that if desired a similar effect can be obtained by merely providing a door over the entire assembly of closely spaced metal plates.

In one embodiment of apparatus similar to that hereinabove described and illustrated in FIG. 1, the ribs 11 may be of appreciably lower height and may even be eliminated if adequate cooling to the chassis is obtained. Such modification permits closer spacing of circuit board assemblies. To further permit dense packing it has been found that the leads 16 on circuit components may be cut to a shorter length than standard.

In a conventional DIP the leads 16 typically have a flat portion about 0.06 inch wide extending from the bend to a short distance above the upper face of the body 14. The leads then narrow to about 0.02 inch for the balance of their length. This narrower extension is typically in a socket or through holes in a circuit board. It has been found that in the "dead bug" arrangement employed in practice of this invention, the narrow extension can be cut off. Electrical connection is then made between the wide flat portions of the leads 16 and the square pins 21. Both the leads and pins extend only a very short distance above the body 14, only enough that a pair of heated jaws can engage them for forming a solder joint. At least 0.1 inch per circuit board can be saved and much denser packing thus achieved. This technique is, of course, also usable in other "dead bug" arrangements not employing a metal cooling plate.

Although limited embodiments of circuit component mounting means have been described and illustrated herein, many modifications and variations that provide for heat dissipation from circuit components will be apparent to one skilled in the art. Thus, for example, the conductor sheet 27 may have conventional printed circuits thereon in lieu of or in addition to the conductive sheets illustrated. Such circuits can supplement or replace wire-wrapped connections. It is therefore to be understood that within the scope of the appended claims the invention may be practiced otherwise than as specifically described.

What is claimed is:

1. A combination comprising:

a circuit component having a plurality of electrical leads extending outwardly therefrom in the same direction;

a metal plate having opposing faces and an elongated opening between the faces, the circuit component being mounted in good thermal contact with one face of the plate with the electrical leads extending away from the elongated opening; and a mounting member on the opposite side of the plate from the circuit component, and including a plurality of connection pins extending through the elongated opening in engagement with the electrical leads and extending away from the mounting member on the opposite side thereof from the metal plate.

2. The combination of claim 1, wherein the metal plate includes a pair of parallel fins extending along one surface of the plate on either side of the circuit component, the fins providing convection cooling for the plate and thus the circuit component mounted thereon.

3. The combination of claim 1, wherein the circuit component is an integrated circuit encapsulated in a nonconductive substrate having opposing faces, one of which engages the metal plate, the terminal pins extending through the substrate and away from the face thereof that is adjacent the metal plate.

4. The combination of claim 1, further comprising a conductor sheet; and wherein the mounting member includes a non-conductive housing through which the connection pins extend, one side of the housing being mounted on the face of the metal plate and the conductor sheet being located on the other side of the housing.

5. A combination comprising:

a circuit component having a plurality of electrical leads extending outwardly therefrom in the same direction;

a metal plate having opposing faces and an elongated opening between the faces, the circuit component being mounted in good thermal contact with one face of the plate with the electrical leads extending away from the elongated opening;

a conductor sheet having two voltage layers and a ground layer, and an elongated slot corresponding to the elongated opening through the metal plate;

a mounting member having one side mounted on the metal plate on the opposite side thereof from the circuit component, and including a non-conductive housing and a plurality of connection pins each having one end extending through the housing and through the elongated opening in engagement with the electrical leads and the other end extending away from the mounting member on the opposite side thereof from the metal plate through the slot in the conductor sheet; and a conductive tab extending into the slot on at least one of the layers in contact with a connection pin.

6. A combination for mounting integrated circuit components or the like comprising:

a metal plate having at least a pair of parallel elongated openings therethrough, and a component receiving surface between the openings;

an insulating mounting member on the opposite side of the plate from the component receiving surface and including a boss extending into each of the openings;

a plurality of conductive pins extending from the mounting member through each of the openings and sufficiently beyond the component receiving surface for contacting leads of a circuit component; and means on the opposite side of the mounting member from the plate for electrically interconnecting selected ones of the conductive pins.

7. A combination as defined in claim 6 wherein the conductive pins extend from the mounting member on the opposite side thereof from the metal plate; and wherein the means for electrically interconnecting comprises wrappings of wire around at least some of the conductive pins.

8. A combination as defined in claim 7 further comprising:

a metal grounding sheet on the opposite of the mounting member from the metal plate;

a metal voltage supply sheet adjacent the grounding sheet and insulated therefrom, said conductive pins extending through apertures in the grounding sheet and voltage supply sheet; and means for connecting at least one of the grounding sheets and the voltage supply sheet to selected one of the conductive pins.

9. A combination as defined in claim 8 further comprising:

a rigid connector board along an edge of the metal plate;

a plurality of conductive contact areas on the connector board; and means for electrically connecting each contact area with selected ones of the conductive pins.

10. A combination as defined in claim 7 further comprising means for dissipating heat from the metal plate.

11. A combination as defined in claim 10 wherein the means for dissipating heat comprises a plurality of fins on the face of the metal plate opposite the mounting member for convection cooling.

12. A combination as defined in claim 10 wherein the means for dissipating heat comprises thermal contact areas on side edges of the metal plate for conduction cooling.

13. The combination comprising:

a thermally conductive plate having opposing surfaces and a plurality of pairs of parallel elongated openings therethrough;

a plurality of integrated circuit components each having a non-conductive housing and a plurality of terminal leads extending through the housing and outwardly therefrom in the same direction, the terminal leads being arranged into pairs with one lead of each pair being aligned with one lead of every other pair so that two parallel rows of terminal leads are formed, each integrated circuit component housing being in good thermal contact with one surface of the plate with the terminal leads of each row adjacent a corresponding elongated opening and extending away from said opening, whereby the plate provides conduction cooling for the integrated circuit components;

a circuit board having pairs of parallel elongated slots therethrough mounted with one side thereof adjacent the other surface of the plate so that each pair of elongated slots is aligned with a pair of elongated openings;

a plurality of conductive pins extending through the openings and the slots and in electrical contact with the terminal leads; and means for electrically interconnecting selected ones of the conductive pins on the opposite side of the plate from the integrated circuit component.

14. The combination of claim 13 further comprising a plurality of nonconductive housings each having opposing sides and each including a pair of portions extending into each of a pair of elongated openings respectively, one side of each housing being mounted to the surface of the plate opposite the components and the one side of the circuit board being mounted to the other side of each housing, the conductive pins being mounted in and extending through the housings.

15. The combination of claim 14 wherein the means for interconnecting comprises wire having a portion wrapped around the pins.

16. The combination of claim 13 wherein at least a portion of the plurality of pairs of elongated openings are arranged into a corresponding pair of rows of elongated openings; and further comprising a strip of nonconductive material having opposing sides and having bosses extending into a portion of the pair of columns of elongated openings, one side of the strip being mounted to the surface of the plate opposite the components and the one side of the circuit board being mounted to the other side of the strip, the conductive pins being mounted in and extending through the strip.

17. The combination comprising:

a thermally conductive plate having opposing surfaces and a plurality of pairs of parallel elongated openings therethrough;

a plurality of integrated circuit components each having a non-conductive housing and a plurality of terminal leads extending through the housing and outwardly therefrom in the same direction, the terminal leads being arranged into pairs with one lead of each pair being aligned with one lead of every other pair so that two parallel rows of terminal leads are formed, each integrated circuit component housing being in good thermal contact with one surface of the plate with the terminal leads of each row adjacent a corresponding elongated opening and extending away from said opening, whereby the plate provides conduction cooling for the integrated circuit components;

a circuit board having pairs of parallel elongated slots therethrough mounted with one side thereof adjacent the other surface of the plate so that each pair of elongated slots is aligned with a pair of elongated openings;

a plurality of conductive pins extending through the openings and the slots and in electrical contact with the terminal leads;

means for electrically interconnecting selected ones of the conductive pins on the opposite side of the plate from the integrated circuit component;

a rigid connector member along an edge of the thermally conductive plate;

a plurality of electrically conductive contact areas on the connector member; and means electrically connecting each contact area with selected ones of the conductive pins.

* * * * *